United States Patent [19]

Coe

[11] Patent Number: 4,774,560
[45] Date of Patent: Sep. 27, 1988

[54] HIGH VOLTAGE GUARD RING WITH VARIABLE WIDTH SHALLOW PORTION

[75] Inventor: David J. Coe, East Grinstead, England

[73] Assignee: U.S. Philips Corp., New York, N.Y.

[21] Appl. No.: 129,890

[22] Filed: Nov. 10, 1987

Related U.S. Application Data

[60] Continuation of Ser. No. 844,264, Mar. 25, 1986, abandoned, which is a division of Ser. No. 570,565, Jan. 13, 1984, Pat. No. 4,602,266.

[30] Foreign Application Priority Data

Jan. 28, 1983 [GB] United Kingdom ................. 8302443

[51] Int. Cl.[4] .......................................... H01L 29/34
[52] U.S. Cl. ........................................ 357/52; 357/20; 357/23.8; 357/38
[58] Field of Search ................... 357/52, 13, 23.8, 38, 357/20, 12

[56] References Cited

U.S. PATENT DOCUMENTS

| 3,341,380 | 9/1967 | Mets et al. | 357/13 |
|---|---|---|---|
| 4,024,564 | 5/1977 | Shimada et al. | 357/52 |
| 4,414,560 | 11/1983 | Lidow | 357/52 |
| 4,532,534 | 7/1985 | Ford et al. | 357/23.8 |

FOREIGN PATENT DOCUMENTS

| 52-4787 | 1/1977 | Japan | 357/52 |
|---|---|---|---|
| 55-46547 | 4/1980 | Japan | 357/52 D |
| 57-73932 | 5/1982 | Japan | 357/52 |
| 58-100460 | 6/1983 | Japan | 357/52 |
| 59-72764 | 4/1984 | Japan | 357/52 |
| 61-158177 | 12/1984 | Japan | 357/52 |

Primary Examiner—Andrew J. James
Assistant Examiner—Gregory A. Key
Attorney, Agent, or Firm—Robert T. Mayer

[57] ABSTRACT

At least one annular region (11,12, ...) extends around an active device region (10) and is located within the spread of a depletion layer (25) from a reverse-biased p-n junction (20) formed by the device region (10) to increase the breakdown voltage of the junction (20). The device region (10) and/or at least one inner annular region (11,12, ...) includes at least one shallower portion (10b,11b, ...) which extends laterally outwards from a deep portion (10a,11a,12a, ...) and faces the surrounding annular region to change the spacing and depth relationship of these regions. This permits high punch-through voltages to be achieved between the regions (10,11,12, ...) while reducing peak fields at the bottom outer corners of the regions (10,11,12, ...). Inwardly-extending shallow portions (11c,12c,...) may also be included. The shallow portions (10b,11b,11c,12c...) may extend around the whole of a perimeter of the region or be localized where higher electrostatic fields may occur around the perimeter.

9 Claims, 2 Drawing Sheets

HIGH VOLTAGE GUARD RING WITH VARIABLE WIDTH SHALLOW PORTION

This is a continuation of application Ser. No. 844,264, filed Mar. 25, 1986, which was a division of application Ser. No. 570,565, filed Jan. 13, 1984, now U.S. Pat. No. 4,602,266 issued 7/22/86.

The invention relates to semiconductor devices, for example rectifier diodes, field-effect transistors, bipolar transistors and thyristors, having a p-n junction which is operated under reverse bias in at least one mode of operation of the device.

The article entitled "High Voltage Planar P-N Junctions" by Y. C. Kao and E. D. Wolley in the Proceeding of the I.E.E.E., Vol. 55, No. 8, August 1967, pages 1409 to 1414 describes semiconductor devices having a concentric field-limiting planar junction structure to increase the breakdown voltage. These devices comprise a semiconductor body having a portion of one conductivity type adjoining a major surface of the body. An active device region of the opposite conductivity type also adjoins said major surface and forms with said portion a main p-n junction which terminates at said major surface and which is operated under reverse bias in at least one mode of operation of the device. At least one annular region of said opposite conductivity type extends around said active device region. This annular region also adjoins said major surface and forms with said portion an auxiliary p-n junction located within the spread of a depletion layer from the reverse-biased main p-n junction so as to increase the breakdown voltage of the main p-n junction. Said active device region and said annular region are more highly doped than said portion of the body.

As described in the Proc. I.E.E.E. article, in the absence of the annular regions, a significantly higher electric field occurs at the surface-terminating portion of the main p-n junction than at the bulk portion which extends parallel to the surface, so resulting in avalanche breakdown of the p-n junction at the surface. The provision of the annular region(s) reduces the field at the surface so that breakdown does not occur until a higher voltage level which is comparable with the plane breakdown voltage of the bulk portion of the junction. The annular regions are spaced such that, at a voltage considerably less than the breakdown voltage of the bulk portion of the main junction, the space charge region of the main junction punches through to the surrounding annular region. After the punch-through, further increases in voltage are largely taken up by the first annular region junction as the carriers are depleted on the outside of the annular region junction. The maximum electric field occurring across the main junction adjacent the surface is determined by the punch-through voltage and so can be controlled to be considerably less than the critical field, by adjusting the spacings. Thus the annular regions act like voltage dividers with the voltage between the main junction and the annular regions being a function of the spacing.

The annular regions of the devices disclosed in the Proc. I.E.E.E. article are all of uniform depth and are generally formed in the same process steps as the active device region so as to have the same doping concentration and depth as the active device region. Depths in the range of 35 to 65 $\mu$m were chosen for these regions in the experimental devices for which results are given in said article. These annular regions of the experimental devices had widths of about 300 $\mu$m, with the innermost annular regions spaced about 75 $\mu$m from the active device region. The said article mentions the effect of junction curvature (for the active device region) in increasing the electric field at the surface so reducing the breakdown voltage. Although the provision of the annular regions reduces this field due to junction curvature, there is still the implication that the breakdown performance deteriorates for junctions of smaller radii resulting from the use of shallower active device regions and shallower annular regions. Thus, in general, it would appear to be desirable to have as large a depth as possible for the active device region and annular region.

The present invention is based on a surprising discovery by the present inventor that the device breakdown performance can be enhanced by the active device region and/or at least one inner annular region including a shallower portion which extends laterally from a deep portion and faces a surrounding annular region to change the spacing and depth relationship of these regions.

Thus, according to the present invention, there is provided a semiconductor device comprising a semiconductor body having a portion of one conductivity type adjoining a major surface of the body, an active device region of the opposite conductivity type also adjoining said major surface and forming with said portion a main p-n junction which extends to said major surface and which is operated under reverse bias in at least one mode of operation of the device, and at least one annular region of said opposite conductivity type extending around said active device region, which at least one annular region adjoins said major surface and forms with said portion an auxiliary p-n junction located within the spread of a depletion layer from the reverse-biased main p-n junction so as to increase the breakdown voltage of the main p-n junction, said active device region and said annular region being more highly doped than said portion of the body, characterized in that, of the group formed by the active device region and the annular regions, at least a first region comprises both a deep portion and a shallower portion which extends laterally outwards from the deep portion towards a surrounding annular region of the group. Thus at the location where the shallower portion is provided the deep portion of said first region is spaced further from the surrounding annular region than is the shallower portion.

Enhanced breakdown performance is achievable with such a device structure in accordance with the invention as compared with a device structure having its group of regions formed either as deep portions only or as shallow portions only. The peak electrostatic field associated with curvature of the equipotential surfaces adjacent the bottom outer corner of the first region is reduced by the field lines being stretched apart by the presence of the shallower portion and the larger spacing of the deep portion of the first region. It is particularly advantageous to include such a shallower portion for this purpose around the outside of the active device region and one or more inner annular regions of the group where the electrostatic field may otherwise be particularly high. For a given breakdown voltage the punch-through voltage between the first region and surrounding annular region is of an intermediate value between that which would occur with shallow portions only and that which would occur with deep portions only having the larger spacing. By using both deep and shallower portions in this manner for the active device region and preferably also for at least an inner annular region(s), the device designer is given an extra degree of freedom which permits high punch-through voltages to be achieved while reducing the peak field at the bottom outer corner of the region.

By way of contrast, if no shallower portions in accordance with the invention are incorporated and the deep regions are instead more closely spaced to achieve the same spacing at the major surface as with the shallower portion(s), a very high peak field has been found to occur at the bottom outer corner of the region, and this leads to premature breakdown. Furthermore, it is also technologically difficult to form deep regions closely spaced together in a reliably reproduced manner, because the regions may merge together as a result of considerable lateral diffusion of the dopant forming the deep regions.

Thus, such shallower portions incorporated in accordance with the invention are preferably provided for at least the inner annular region(s) as well as for the active device region in order to obtain similar advantages for these regions. Thus, at least on its outer side the surrounding annular region also preferably comprises a shallower portion which extends laterally outwards from a deep portion of the annular region and which is of substantially the same doping concentration and depth as said shallower portion of the active device region.

It is technologically difficult to obtain in a reliably reproducible manner a close spacing between two regions formed in different process steps, especially when one of the regions is deeper than the other. Thus it is technologically advantageous when (at least on its side which faces towards the active device region) the surrounding annular region comprises a shallower portion which extends laterally (inwards) from a deep portion of the annular region and which is of substantially the same doping concentration and depth as said shallower portion of the active device region so that the minimum spacing between the active device region and the surrounding annular region is determined by the spacing between their shallow portions.

The number, width and spacing of the annular regions depend on the desired breakdown voltage and the depth of the junctions. One or two annular regions may be sufficient for some low voltage devices or for high voltage devices which have deep junctions (e.g. at least 30 μm deep). Usually more than two annular regions will be provided, especially for devices where the active device region and annular regions are moderately shallow, for example where said deep portion of the region is less than 10 μm.

When there is present around the active device region a concentric plurality of said annular regions, all the annular regions may be formed with both shallow portions and deep portions. However the advantages provided by the invention in using both shallow and deep portions are particularly important for the high electrostatic fields near the active device region and are less significant remote from the active device region. Thus, at least one inner annular region preferably comprises the shallow portion on at least one side (and preferably both sides), whereas at least one outer annular region may consist solely of a deep region having substantially the same doping concentration and depth as the deep portion of said at least one inner annular region.

By forming the outer annular region or regions solely as such a deep region a saving can be made in the area of the major surface required to accommodate the concentric system of annular regions, especially when the spacing and width of the annular regions is varied to optimise the breakdown voltage performance. For such optimisation purposes it is desirable for the spacing between the annular regions which are remote from the active device region to be larger than the spacing of the inner annular regions. Furthermore as disclosed in the co-pending US patent application based on the unpublished GB patent application 8234609 to which U.S. Pat. No. 4,573,066 corresponds it is advantageous for the annular regions to the wider adjacent the active device region than remote from the active device region. This advantage can also be obtained in accordance with the present invention when said at least one inner annular region which comprises both shallow and deep portions is wider than said at least one outer annular region which consists solely of the deep region.

The region structure of the present invention may be used with many different types of device, for example power rectifier diodes, high voltage transistors and thyristors. Depending on the type of device, the shallow portion of the active device region and annular regions may be formed by merely changing a mask pattern and using process steps already needed for the device structure. Thus, for example, the deep portion of the active device region may be a base contact region of a bipolar transistor and the shallower portion may be formed in the processing steps used to form a shallower intrinsic base portion below the emitter region of the transistor. In another example the device may be a so-called D-MOS transistor in which said active device region is the deep contact region of the transistor base (sometimes called "substrate"), and the shallower portion may be formed in the steps used to form a shallower base/substrate portion which underlies the insulated gate and in which the conductive channel of the transistor is induced by field-effect action. The active device region may also be the drain region of an MOS transistor, and the shallower portion may be formed in the steps used to form a shallower drain extension of the drain region to the edge of the insulated gate.

Embodiments of the present invention will now be described, by way of example, with reference to the accompanying diagrammatic drawings, in which.

Figure 1:
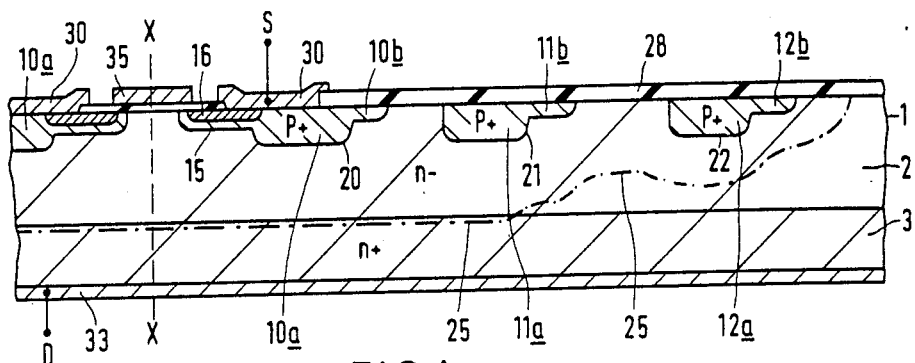
FIGS. 1 to 3 are cross-sectional views of similar parts of a semiconductor body of three different semiconductor devices in accordance with the invention.

It should be noted that none of these Figures are drawn to scale and that various portions of these devices are shown exaggerated or reduced in size for the sake of clarity and convenience in the drawings. Furthermore, corresponding and similar features in the different embodiments are generally given the same reference signs to facilitate understanding and comparison of the different embodiments.

The semiconductor device of FIG. 1 comprises a semiconductor body 1 (for example of monocrystalline silicon) having a portion 2 of one conductivity type (n-type, in the example shown in the drawing) which adjoins the upper major surface of the body 1. An active device region 10a, 10b of the opposite conductivity type (p-type, in the example shown) also adjoins said upper major surface and forms with the body portion 2 a main p-n junction 20 which extends to the upper major surface and which is operated under reverse bias in at least one mode of operation of the device, by applying a bias voltage between the electrodes 30 and 33 in FIG. 1.

Concentric annular regions 11a, 11b and 12a, 12b of said opposite conductivity type (p-type, in the example) are arranged concentrically around the active device region 10a, 10b. These annular regions 11a, 11b and 12a, 12b also adjoin the upper major surface and form with the body portion 2 auxiliary p-n junctions 21 and 22 within the spread of a depletion layer 25 from the reverse-biased main p-n junction 20 so as to increase the breakdown voltge of the main p-n junction 20.

The active device region 10a, 10b and annular regions 11a, 11b and 12a, 12b are more highly doped than the body portion 2 and may be formed by locally implanting or/and diffusing dopant of the opposite conductivity type (p-type) to locally overdope the body portion 2. As will be described hereinafter, the annular regions 11a, 11b and 12a, 12b may be formed simultaneously with one or more active regions of the device, especially the device region 10a, 10b. The upper major surface of the body 1 is passivated at the area of the annular regions 11a, 11b and 12a, 12b by an insulating layer 28 (for example of silicon dioxide).

The concentric annular regions 11a, 11b and 12a, 12b may be circular rings which have circular symmetry around the active device region 10a, 10b at the upper major surface of the body 1. Thus, for example the device structure shown in the drawings may have circular symmetry around an axis x-x as illustrated in the drawings. However, other geometrical outlines are possible, depending on the outline of the active device region 10a, 10b and the type of the device. Thus, for example the region 10a, 10b may have a square outline with straight sides but with rounded corners, and the concentric rings 11a, 11b and 12a, 12b may be similarly square with straight sides and rounded corners.

Such different outlines and geometrics are already known in the power semiconductor device art and so will not be described further in the present specification. For convenience and simplicity in the drawing, FIGS. 1 to 3 merely show a cross-section through part of the region structure, mostly on the right-hand side of the axis x—x. In accordance with conventional practice in the power semiconductor device art a highly doped annular channel-stopper region of the same conductivity type as the body portion 2 will generally be provided towards the periphery of the upper major surface of the body 1, in a concentric arrangement around the outermost annular region (12a, 12b shown in FIG. 1). Such a channel-stopper region is not illustrated in the drawings, for the sake of convenience and simplicity.

The concentric annular regions 11a, 11b and 12a, 12b serve to increase the breakdown voltage of the p-n junction 20 by widening the spread of the depletion layer 25 along the body surface so as to reduce the associated electrostatic field adjacent the surface to a value less than that of the critical field for electron-hole pair generation by avalanche breakdown. However a peak electrostatic field has been found to occur in the depletion layer 25 at the outer bottom corner of the active device region 10 and/or at the outer bottom corner of the inner annular region(s) 11 etc. This peak electrostatic field results from curvature of the equipotential surfaces adjacent these bottom corners between neighbouring regions, especially when the regions 10, 11 etc. and junctions 20, 21 etc. are of shallow depth compared with the depth of the depletion layer 25 from the junction or the spacing between adjacent regions 10, 11, 12. If the annular regions 11 and 12 were formed in accordance with the previously known configuration, the regions 10, 11 and 12 would be of uniform depth (i.e. the same depth as device region portion 10a of FIG. 1), and the breakdown voltage of the main junction 20 may then be limited by avalanche breakdown from one of these peaks. If the regions 10, 11 and 12 were moved closer together to reduce these peak fields the punch-through voltage between the regions is reduced so that more annular regions would be required to support a given voltage. There is also a technological limit on how closely such deep regions can be spaced in a reliably reproducible manner in a manufacturing process. Reducing the depth of the regions 10, 11 etc. however increases the peak fields.

In accordance with the present invention these peak electrostatic fields are reduced while also obtaining high punch-through voltages by the active device region 10 and/or at least one inner annular region 11 having a shallower portion 10b, 11b which extends laterally outwards from a deep portion 10a, 11a of the region 10, 11 to face a surrounding second region 11, 12 respectively so that at that location (as illustrated in FIG. 1) the deep portion 10a, 11a of the first region 10, 11 is spaced further from the surrounding second region 11, 12 than is the shallower portion 10b, 11b. In the device structure of FIG. 1 the shallower portion 10b may extend in plan view around the whole outer perimeter of the active device region 10, and the shallower portion 11b, may extend around the whole outer perimeter of the annular region 11. A similar shallower portion 12b is also included around the whole outer perimeter of the annular region 12 in FIG. 1.

As is already noted, FIG. 1 is not drawn to scale and the proportions and especially the thickness/depth of various portions have been exaggerated or reduced for the sake of clarity and convenience in the drawing. The precise number, widths, spacings and depths of the annular regions 11, 12 etc. and the deep and shallow portions 10a, 10b, 11a, 11b, 12a, etc. are chosen as appropriate to the type of device and the desired breakdown voltage. For example at least four or more concentric annular regions 11, 12, etc. may be provided for a device having a breakdown voltage in excess of 500 volts and having a depth of about 3 $\mu$m for the deep portions 10a, 11a etc. of the regions 10, 11 etc. In this case, the width of the innermost annular region 11 may be, for example, more than seven times its depth, more than ten times the spacing of the region 11 from the active device region 10 and more than twice the width of the outermost annular region, and the spacing of the outer annular regions is preferably larger than that of the inner annular regions 11, 12.

By way of example, FIG. 1 illustrates an insulated-gate field-effect transistor of a so-called D-MOS type having this deep and shallower region structure in accordance with the invention. In this case, the deep portions 11a, 12a etc. of the annular regions may be formed in the same photolithographic and doping steps as the p-type contact region 10a normally provided for the D-MOS transistor and may have a depth of for example 3 $\mu$m. The shallower portions 10b, 11b, 12b etc. may be formed in the same photolithographic and doping steps as the p-type region 15 in which the transistor channel is induced during operation of the transistor and may have a depth of for example 1 μm. In this case it is however necessary to mask said shallower portions 10b, 11b, 12b etc. against the donor introduction subsequently performed to provide an n-type source region 16 in the p-type region 15 in known manner to define the active channel length below the insulated gate 35 of the transistor.

Thus in this example the main p-n junction 20 is a transistor drain junction, and the body portion 2 which is a drain drift region of the transistor and may be formed as a high resistivity n-type layer on a highly conductive n-type substrate 3. Reference 28 indicates an insulating passivating layer, for example of silicon dioxide, on the upper surface of the epitaxial layer 2, to passivate the surface terminations of the p-n junctions 20, 21, 22 etc. In this device structure, metallization 30 forms a source electrode and metallization 33 forms a drain electrode of the transistor.

This deep and shallower region structure 10a, 10b, 11a, 11b, etc. may be used in accordance with the invention for other types of device, for example a power rectifier, a high voltage transistor, a thyristor or other types of insulated-gate field-effect transistor. It will also be evident that modifications of this deep and shallower region structure are possible both for the D-MOS transistor of FIG. 1 and for these other types of device in accordance with the invention. Thus, for example similar shallower portions may extend around the inner perimeter of the annular regions 11, 12 etc. instead of or in addition to the portions 11b, 12b etc. around the outer perimeters, and one or more of the annular regions 11, 12 etc., especially the outer region(s), may consist solely of regions of uniform depth.

Figure 2:
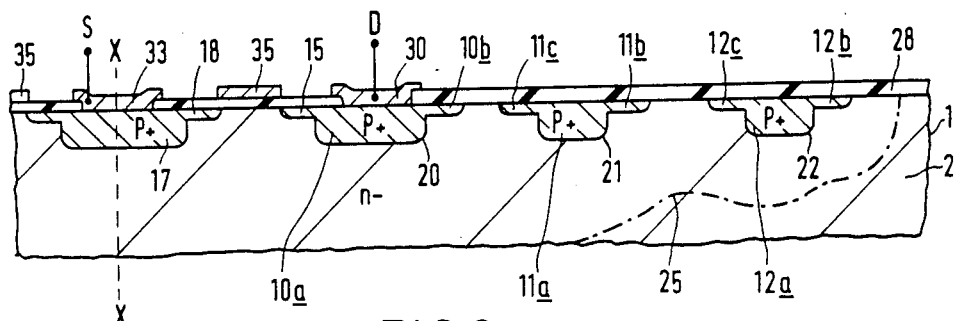

FIG. 2 illustrates a deep and shallower region structure 10a, 10b, 11a, 11b, 11c, 12a, 12b, 12c, etc. in which the annular regions 11 and 12 have shallower portions 11b, 12b and 11c, 12c around both their outer and inner perimeters. By forming all the shallower portions 10b, 11b, 11c, 12b, 12c in the same photolithographic and doping steps, all these shallow portions have the same doping concentration and depth and the minimum spacings between the consecutive regions 10, 11, and 11, 12 are determined in these steps which define the spacing between the shallow portions 10b and 11c, and 11b and 12c. This provides a more reliable and reproducible way of defining the minimum spacing between the consecutive regions, compared with the situation of FIG. 1 where the minimum spacing is determined by the alignment of the different masks used to form the deep portions 10a, 11a, 12a and the shallower portions 10b, 11b, 12b. This is particularly advantageous for defining the spacing of the inner regions, since it is often desirable to define the annular region configuration in such a manner that the spacing of annular regions which are near the active device region 10 is less than the spacing of annular regions which are remote from the active device region. This situation is illustrated in the drawings by the spacing of regions 10 and 11 being less than that of regions 11 and 12.

Figure 3:
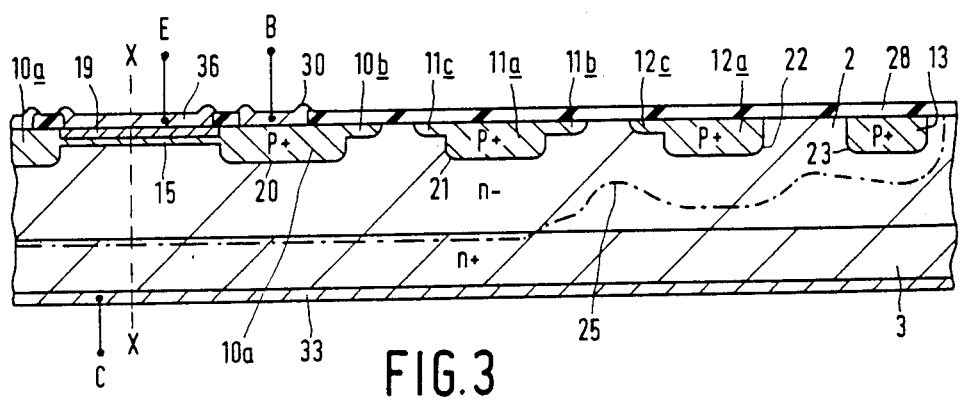

Another modification of the deep and shallower region structure is illustrated in FIG. 3. In this example an outer annular region 13 consists solely of a deep p-type region having substantially the same doping concentration and depth as the deep portions 10a, 11a, and 12a of the regions 10, 11 and 12. Such a structure can be readily designed to optimise the breakdown performance by having both the spacing of the annular regions larger remote from the active device region 10 and the width of the annular regions larger adjacent the active device region 10. In this example the shallower portions 10b, 11c, 11b, 12c contribute to achieving the smaller spacing and larger width of the inner annular regions, as well as reducing the peak electrostatic fields in the manner described. There is also no outer shallow portion 12b of the region 12 so that the spacing between the annular regions 12 and 13 may be defined reliably and reproducibly by forming the deep region 13 and deep portions 12a, 11a etc. in the same photolithographic and doping steps.

By way for example, FIGS. 2 and 3 also illustrate the use of such deep and shallower region structures for another type of insulated-gate field-effect transistor and for a bipolar transistor. In FIG. 2, the active device region 10 is a drain region of the transistor having a highly-doped p-type contact region 10a which is formed in the high resistivity body portion 2 simultaneously with a highly doped p-type source region 17. These source and drain regions 17 and 10 are extended towards each other in known manner by shallower lower-doped source and drain region extensions 18 and 15, the facing edges of which are aligned with the edges of the transistor gate 35. In this case metallization 30 forms a drain electrode, and metallization 33 which contacts the source region 17 and is also connected to the body portion 2 forms a source electrode of the transistor. The shallow portions 10b, 11b, 11c, 12b, etc. can be formed in the same photolithographic and doping steps as the source and drain extensions 18 and 15, for example by ion implantation, and in this case may have a depth of about 1 μm while the deep portions 17, 10a, 11a, etc. may have a depth of about 2 μm.

In the bipolar transistor structure of FIG. 3, the body portion 2 is an n-type high resistivity epitaxial layer on a highly-doped n-type substrate 3 and forms the collector region of the transistor. The p-type region portion 10a is a deep base contact region surrounding a shallower p-type active base region 15 which is present between the n-type collector region portion 2 and an n-type emitter region 19 of the transistor. In this case the metallization 30 forms a base electrode, the metallization 33 forms a collector electrode, and metallization 36 forms an emitter electrode. The shallow portions 10b, 11b, 11c, etc. can be formed simultaneously with the active base region 15, but are masked against the doping for providing the emitter region 19. The shallow portions 10b, 11b, 11c, etc. may in this case have a depth of for example about 3 μm, while the deep portions 10a, 11a, etc. may have a depth of for example at least 5 μm.

Figure 4:
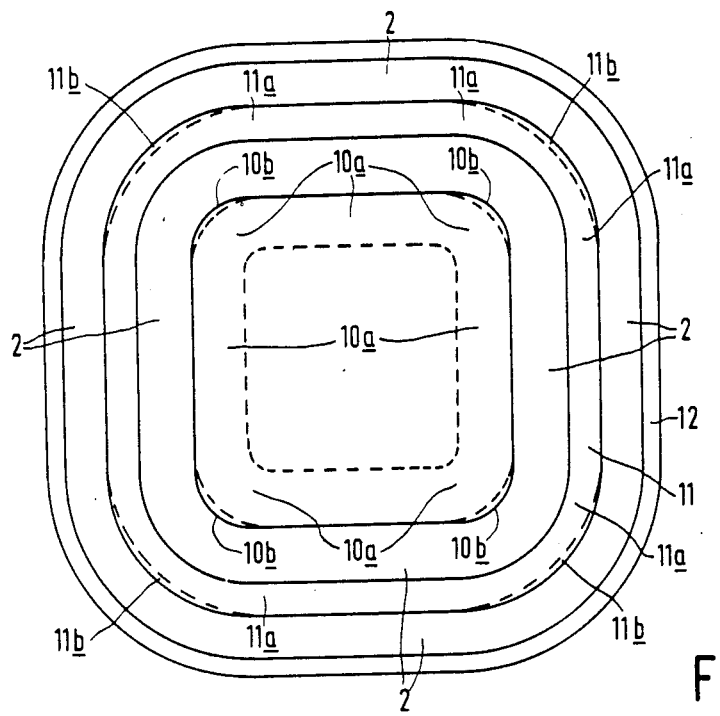
FIG. 4 is a plan view of part of another device in accordance with the invention.

In the examples so far described, the shallow portions 10b, 11b etc. extend around the whole of a perimeter of their respective region 10, 11, etc. It can be advantageous to vary the width of the shallow portions with their location around the perimeter, especially in annular region configurations which result in higher peak electrostatic fields at particular locations around the perimeter. FIG. 4 illustrates one example of a concentric annular region structure 11, 12 around the active device region 10, all the regions 10, 11, 12 of which have rounded-square perimeters which as shown in plan view of FIG. 4 consist of straight sides joined by rounded corners. In order to reduce the higher peak fields which occur at the rounded corners of the perimeter, the regions 10 and 11 are provided at these corners with shallower portions 10b and 11b which extend laterally from the deep portions 10a and 11a of the regions. At the straight sides of the perimeter the regions 10 and 11 of the device structure as illustrated in FIG. 4 consist solely of the deep portions 10a and 11a. However in a modified form, the shallow portions 10b and 11b may extend around the whole outer perimeter of the regions 10 and 11 in FIG. 4 and may have a reduced width along the straight sides of the perimeter as compared with an increased width at the rounded corners of the perimeter.

Figure 5:
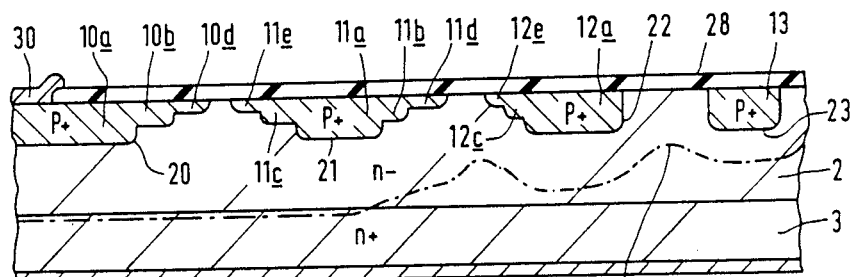
FIG. 5 is a cross-sectional view of part of yet another device in accordance with the invention.

In the examples so far described, the shallow portions 10b, 11b, etc. are of uniform depth. However one or more of these shallow portions 10b, 11b, etc. may have a smaller depth remote from the deep portion 10a, 11a, etc. than adjacent the deep portion 10a, 11a, etc. One such example is illustrated in the cross-sectional view of FIG. 5, where the regions 10, 11 and 12 have two depths of shallow portion, the end portions 10d, 11d, 11e, 12e being shallower than the intermediate portions 10b, 11b, 11c, 12c. It is also possible to form shallow portions having a gradually varying depth (e.g. varying gradually from the 10a depth to the 10d depth, or from the 10b depth to the 10d depth) by implanting the shallow portion through a bevelled edge of an implantation mask window. It is generally desirable to provide the shallow and deep portions 10b, 11a, 11b, etc. simultaneously with regions forming part of the active device structure, in which case the shallower portions 10b, 11b, etc. and the deep portions 10a, 11a, etc. will generally have a sufficiently large doping concentration and thickness to be undepleted over a part of their depth by the depletion layer 25 under the normal reverse bias operating conditions. However in some cases it may be desirable for at least an end portion of the shallow portion 10b, 11b, etc. to be provided with such a doping concentration and thickness as to be fully-depleted under the reverse-bias conditions and so to act in a so-called "resurf" manner. In this connection reference is invited to the paper entitled "High voltage thin layer devices (Resurf devices)" by J. A. Appels and H. M. J. Vaes, pages 238 to 241, I.E.E.E. International Electron Devices Meeting, Washington D.C., 1979.

Figure 6:
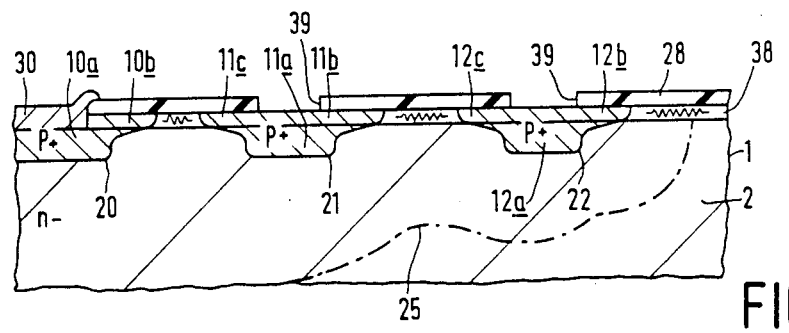
FIG. 6 is a cross-sectional view of part of a further device in accordance with the invention.

A further modification is illustrated in FIG. 6 in which a polycrystalline silicon layer 38 having a higher resistivity than the underlying (n-type) body portion 2 is present on the upper major surface of the body 1, and at least an upper part of at least one shallower portion 10b, 11b, 11c, 12b, 12c etc. and an upper part of the deep region 10a, 11a, 12a, etc. from which this shallower portion laterally extends are (p-type) doped areas in the high resistivity polycrystalline silicon layer 38. The layer 38 has a very high resistivity in order to separate the regions 10, 11 and 12. The layer 38 may be deposited in known manner with a homogeneously-distributed oxygen concentration which increases its resistivity so as to be at least semi-insulating outside each (p-type) doped area. The p-type regions 10, 11, 12 etc. may be formed in the layer 38 and in the underlying body portion 2 by diffusion of acceptor dopant (e.g. boron) through dopant windows 39 in a masking layer provided on the polycrystalline silicon layer 38. Since the acceptor dopant diffuses faster in the layer 38 than in the underlying monocrystalline body portion 2, both the deep portions 10a, 11a, 12a, etc. and the wider shallow portions 10b, 11b, 11c, 12b, 12c, etc. can be formed simultaneously in this case using a single masking step. The masking layer which may be of insulating passivating material may be retained in the final device structure. The doped area of the polycrystalline layer 38 may be removed at the active device areas and at the contact window for the electrode 30, or it may be retained in some device structures.

The nature of the active device regions 10 varies according to the type of device. Thus, in the examples of FIGS. 1 to 3 the region 10 is shown as part of a source region, a drain region and a base region, respectively. In the case of a power rectifier diode the region 10 may form with the body portion 2 the rectifying junction of the diode. However, the rectifying junction of a power rectifier diode in accordance with the invention may be formed by a metal-semiconductor Schottky contact to the body portion 2, and this Schottky junction may be bounded at its periphery by an annular guard region 10 which constitutes the active device region of said opposite conductivity type. The shallow portions 10b, 11b etc. may be included in such annular guard region 10 as well as in surrounding annular regions 11, 12 etc.

It will be evident that many other modifications are possible within the scope of the present invention. For devices having a breakdown voltage of at least 1,000 volts there may be between ten and fifteen annular regions 11, 12, etc., of which the inner annular regions are wider and more closely spaced than the outer annular regions. In this case, the width of the innermost annular region 11, may be, for example, more than twelve times its depth, more than fifteen times its spacing from the active device region 10 and more than five times the width of the outermost annular region. Of these ten to fifteen annular regions, the outer ones may consist solely of deep regions having no shallow portions, whereas different forms of shallow portion as described earlier may be provided for different groups of the remaining annular regions. Thus, for example, one or more innermost annular regions 11, etc. and the active device region 10 may each have two or more shallow portions 10b, 10d, 11b, 11c, 11d, 11e, etc. of different depths whereas the next annular regions may have shallow portions of one depth. Some of the shallow portions for some of the regions may be localised around a perimeter of the region.

It will also be evident that the conductivity types of all the regions of the device may be reversed to form opposite conductivity type devices. Furthermore semiconductor materials other than silicon may be used for the devices, although allowance must then be made for different critical field strengths for avalanche breakdown in such other semiconductor materials. Instead of an insulating layer 28 passivating the body surface, a semi-insulating layer or a combination of insulating and semi-insulating layers may be deposited to passivate the regions 10, 11, 12 etc.

I claim:

1. A semiconductor device comprising a semiconductor body having a portion of one conductivity type adjoining a major surface of the body, an active device region of the opposite conductivity type also adjoining said major surface and forming with said portion a main p-n junction which extends to said major surface and which is operated under reverse bias in at least one mode of operation of the device, and a plurality of annular regions of said opposite conductivity type extending around said active device region, which annular regions adjoin said major surface and form with said portion an auxiliary p-n junction located within the spread of a depletion layer from the reverse biased main p-n junction so as to increase the breakdown voltage of the main p-n junction, said active device region and said annular regions being more highly doped than said portion of the body, said annular regions comprising at least one inner annular region with both deep and shallow portions both adjoining said major surface, a shallow portion of said at least one inner annular region extending laterally inwardly from the deep portion along the entire inward circumference of said at least one inner annular region, said annular regions also comprising an outer annular region consisting solely of a deep region having substantially the same doping concentration and depth as the deep portion of said at least one inner annular region.

2. A semiconductor device as claimed in claim 1, wherein said active device region also has deep and shallow portions, said shallow portions of both said active device region and said at least one inner annular region extending outwardly from the deep portion toward a surrounding annular region.

3. A semiconductor device as claimed in claim 2, wherein said outwardly extending shallow portions extend around the whole of the outer perimeter of said active device region and said at least one inner annular region.

4. A semiconductor device as claimed in claim 3, wherein said at least one inner annular region is wider than said outer annular region.

5. A semiconductor device as claimed in claim 4, wherein the spacing between the annular regions which are remote from the active device region is larger than the spacing of the annular regions which are closer to the active device region.

6. A semiconductor device as claimed in claim 5, wherein the shallow portions of said active device region and said at least one inner annular region have smaller depths remote from the deep portion than adjacent the deep portion.

7. A semiconductor device comprising a semiconductor body having a portion of one conductivity type adjoining a major surface of the body, an active device region of the opposite conductivity type also adjoining said major surface and forming with said portion a main p-n junction which extends to said major surface and which is operated under reverse bias in at least one mode of operation of the device, and a concentric plurality of spaced annular regions of said opposite conductivity type extending around and spaced from said active device region, each of said annular regions adjoining said major surface and forming with said portion an auxiliary p-n junction located within the spread of the depletion layer from the reverse bias main p-n junction so as to increase the breakdown voltage of the main p-n junction, said active device region and each said annular region being more highly doped than said portion of the body, wherein an inner and an outer annular region of said plurality each comprise both deep and shallow portions both portions adjoining said major surface, a shallow portion of each inner and outer annular region extending laterally inwardly from the deep portion along the entire inward circumference of said associated annular region, said annular regions decreasing in width as their depth increases.

8. A semiconductor device as claimed in claim 7, wherein said annular regions where they adjoin said major surface are covered with a passivating layer rendering them incapable of electrical contact.

9. A semiconductor device as claimed in claim 7, wherein said active device region also has deep and shallow portions, said shallow portions of both said active device region and at least said inner annular region extending outwardly from the deep portion toward a surrounding annular region.

* * * * *